United States Patent
Adachi

(10) Patent No.: US 6,696,729 B2
(45) Date of Patent: Feb. 24, 2004

(54) SEMICONDUCTOR DEVICE HAVING DIFFUSION REGIONS WITH DIFFERENT JUNCTION DEPTHS

(75) Inventor: Kanna Adachi, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/075,236

(22) Filed: Feb. 15, 2002

(65) Prior Publication Data

US 2003/0111690 A1 Jun. 19, 2003

(30) Foreign Application Priority Data

Dec. 18, 2001 (JP) ........................................ 2001-384184

(51) Int. Cl.$^7$ .......................... H01L 29/76; H01L 29/94; H01L 31/117
(52) U.S. Cl. ......................... 257/344; 257/408; 257/616
(58) Field of Search ................................. 257/344, 408, 257/616; 438/303

(56) References Cited

U.S. PATENT DOCUMENTS 4,835,112 A * 5/1989 Pfiester et al. ............... 257/344
6,391,731 B1 * 5/2002 Chong et al. ................ 438/303

FOREIGN PATENT DOCUMENTS

JP 2001-156293 6/2001

OTHER PUBLICATIONS

A. Ai–Bayati, et al., 2000 International Conference on Ion Implantation Technology Proceedings, pp. 54–57, "Exploring the Limits of Pre–Amorphization Implants on Controlling Channeling and Diffusion of Low Energy B Implants and Ultra Shallow Junction Formation", Sep. 17, 2000.

* cited by examiner

Primary Examiner—Steven Loke
(74) Attorney, Agent, or Firm—Oblon, Spivak, McClelland, Maier & Neustadt, P.C.

(57) ABSTRACT

An aspect of the present invention includes: a gate insulating layer formed on an n-type silicon semiconductor region; a gate electrode formed on the gate insulating layer; a channel region formed immediately below the gate electrode in the semiconductor region; p-type source/drain regions formed at both sides of the channel region in the semiconductor region; p-type diffusion layer regions formed between the channel region and the source/drain regions in the semiconductor region and having a lower impurity concentration than the source/drain regions; first impurity regions formed near surface portions of the diffusion layer regions; and second impurity regions formed in part of the p-type diffusion layer regions and near surface portions of the source/drain regions, the second impurity regions being deeper than the first impurity regions, the first and second impurity regions containing one element selected from germanium, silicon, gallium, and indium as impurity.

9 Claims, 6 Drawing Sheets

SEMICONDUCTOR DEVICE HAVING DIFFUSION REGIONS WITH DIFFERENT JUNCTION DEPTHS

CROSS-REFERENCE TO RELATED APPLICATION

This application is based upon and claims the benefit of priority from the prior Japanese Patent Application No. 2001-384184, filed on Dec. 18, 2001; the entire contents of which are incorporated herein by reference.

BACKGROUND OF THE INVENTION

1. Field of the Invention

The present invention relates to a semiconductor device and a method of manufacturing the same.

2. Related Background Art

Recently, as the miniaturization of devices advances, MOS transistors including diffusion layer regions (hereinafter also referred to as "extension regions"), of which the impurity concentration is lower than that of source/drain regions, have been proposed. In such a MOS transistor, an extension region, of which the junction depth with a semiconductor substrate or a well is shallow, is required for improving the short channel effect, and an extension region, of which the change in impurity concentration per unit length in the direction of the depth of the semiconductor substrate is considerably large, i.e., the impurity concentration profile in the depth direction of the semiconductor substrate is abrupt, is required to reduce the parasitic resistance (spreading resistance).

When extension regions of source/drain regions are formed by implanting impurities into a semiconductor substrate by the ion implantation method, one way of forming an extension region, of which the junction depth is shallow and of which the impurity concentration profile in the depth direction of the semiconductor substrate is abrupt, is to decrease the acceleration energy at the time of the ion-implantation.

However, if the acceleration energy at the time of the ion-implantation is reduced, especially for a p-channel MOSFET, a problem may arise that the sheet resistance in the extension regions is increased to increase the parasitic resistance, thereby degrading the capability of driving current.

SUMMARY OF THE INVENTION

A semiconductor device according to a first aspect of the present invention includes: a gate insulating layer formed on an n-type silicon semiconductor region; a gate electrode formed on the gate insulating layer; a channel region formed immediately below the gate electrode in the semiconductor region; p-type source/drain regions formed at both sides of the channel region in the semiconductor region; p-type diffusion layer regions formed between the channel region and the source/drain regions in the semiconductor region and having a lower impurity concentration than the source/drain regions; first impurity regions formed near surface portions of the diffusion layer regions; and second impurity regions formed in part of the p-type diffusion layer regions and near surface portions of the source/drain regions, the second impurity regions being deeper than the first impurity regions, and the first and second impurity regions containing one element selected from germanium, silicon, gallium, and indium as impurity.

A method of manufacturing a semiconductor device according to a second aspect of the present invention includes: forming a gate electrode via a gate insulating layer on an n-type silicon semiconductor region; forming a first gate sidewall of an insulating material at a side portion of the gate electrode; forming first impurity regions including an amorphous layer at both sides of the first gate sidewall in the semiconductor region through ion-implantation of one element selected from germanium, silicon, gallium, and indium into the semiconductor region using the gate electrode and the first gate sidewall as masks; and after removing the first gate sidewall, forming second impurity regions including an amorphous layer shallower than the amorphous layer of the first impurity regions through ion-implantation of the one element into the semiconductor region using the gate electrode as a mask.

DESCRIPTION OF THE EMBODIMENTS

Hereinafter, embodiments of the present invention will be described with reference to the accompanying drawings.

(First Embodiment)

Figure 1:
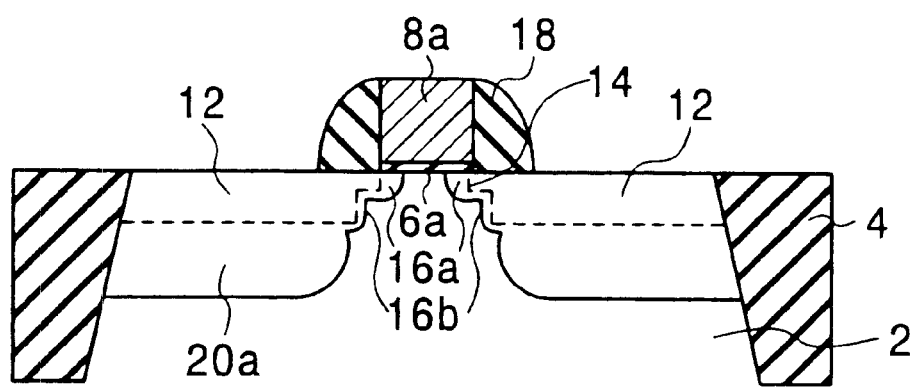
FIG. 1 is a sectional view showing the structure of a semiconductor device according to a first embodiment of the present invention.

FIG. 1 shows the structure of a semiconductor device according to a first embodiment of the present invention. The semiconductor device of this embodiment includes a p-channel MOSFET having a gate insulating layer 6a formed on an n-type silicon semiconductor region 2 isolated by device isolating regions 4, a gate electrode 8a formed on the gate insulating layer 6a, a channel region formed immediately below the gate electrode 8a in the semiconductor region 2, source/drain regions 20a formed at both the sides of the channel region in the semiconductor region 2, diffusion layer regions (extension regions) 16a and 16b formed between the channel region and the source/drain regions 20a and having a lower p-type impurity (e.g., boron) concentration than the source/drain regions 20a, impurity regions 12 and 14 containing germanium as impurity, and a gate sidewall 18 of an insulating material formed at the side portion of the gate electrode 8a.

The impurity regions 12 are formed near the surface of the source/drain regions 20a, and the impurity regions 14 are formed near the surface of the extension regions 16a and 16b. The impurity regions 14 are shallower than the impurity regions 12. As described later, the impurity regions 12, 14 are in the amorphous state, or in the mixed crystal state containing amorphous silicon and crystal silicon.

Generally, germanium is hard to diffuse into a silicon semiconductor region even if heat treatment is performed. The impurity regions 12 and 14 containing germanium have a characteristic to inhibit or advance the diffusion of boron serving as the p-type impurity in the silicon semiconductor region as a result of heat treatment in accordance with the difference in depth of the amorphous layer therein. Accordingly, by preforming the impurity regions 12 and 14 each having the different amorphous layer depth, it is possible to form deep source/drain regions 20a and two-step extension regions 16a and 16b by activation anneal performed after boron implantation. That is, in the impurity regions 12 having a deep amorphous layer, the diffusion of boron is advanced, while in the impurity regions 14 having a shallow amorphous layer, the diffusion of boron is inhibited.

As described above, in the semiconductor device of this embodiment, because of the existence of the extension region 16b, of which the junction depth is deeper than that of the extension region 16a but shallower than that of the source/drain regions 20a, it is possible to reduce the sheet resistance as compared with the conventional devices. Accordingly, even if the miniaturization of devices is carried out, the increase in resistance of the extension regions may be inhibited, and the parasitic resistance may be reduced as compared with the conventional devices, thereby inhibiting the decrease in driving force.

(Second Embodiment)

Figure 2:
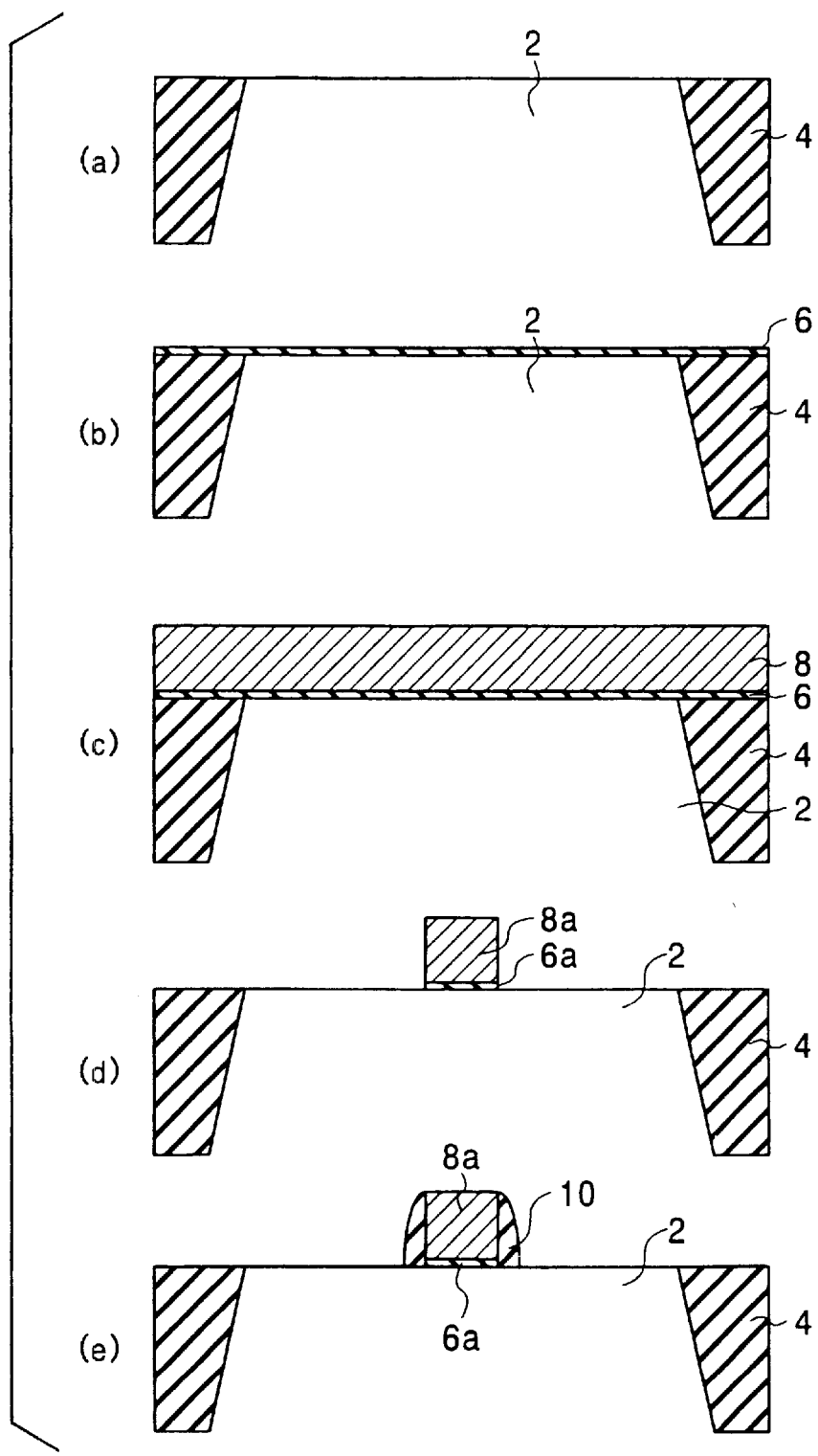
FIGS. 2(a) to 2(e) are sectional views showing a stage of the manufacturing process of a method of manufacturing a semiconductor device according to a second embodiment of the present invention.
Figure 3:
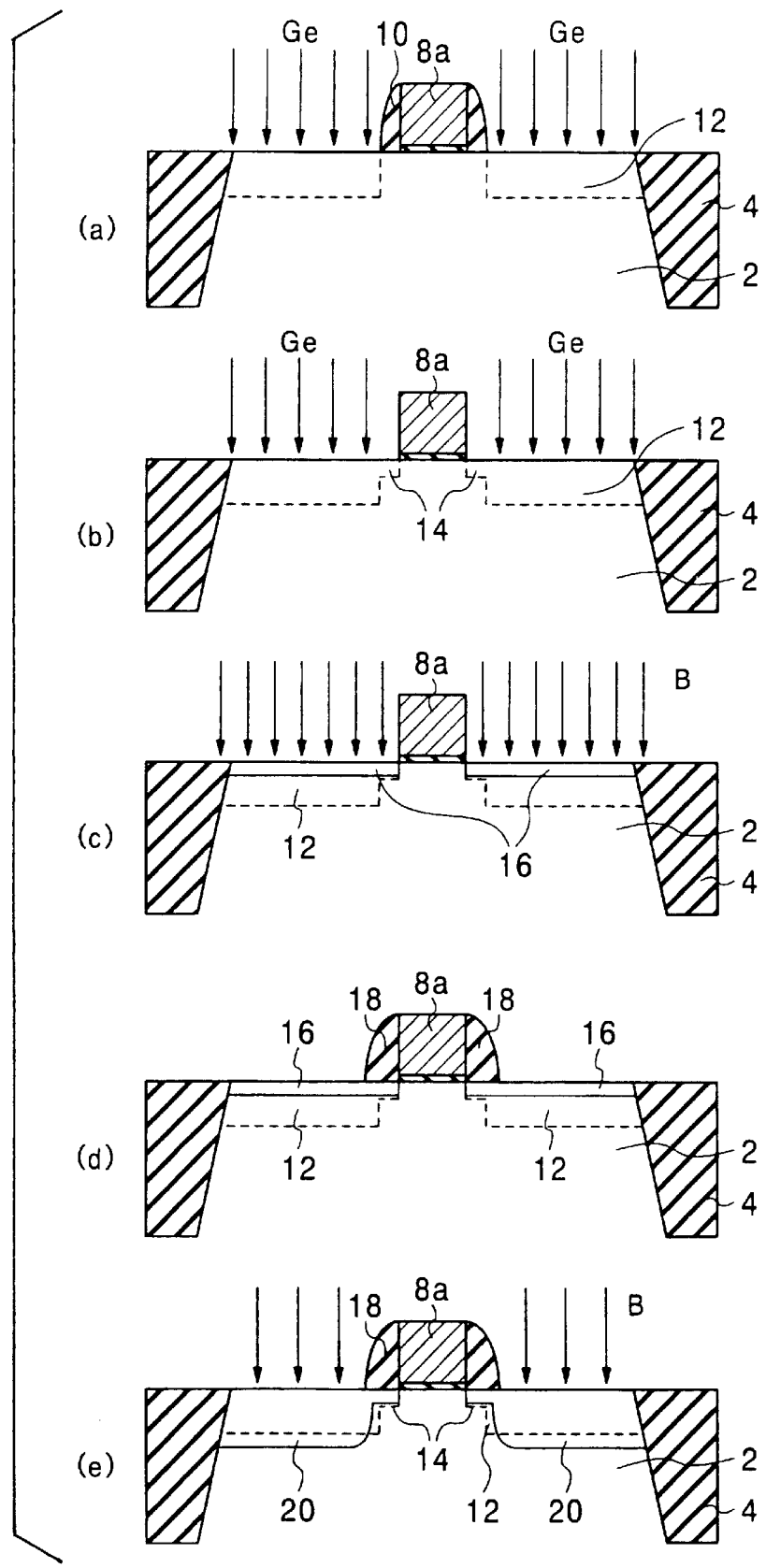
FIGS. 3(a) to 3(e) are sectional views showing another stage of the manufacturing process of the method of manufacturing a semiconductor device according to the second embodiment of the present invention.

Next, a method of manufacturing a semiconductor device according to a second embodiment of the present invention will be described with reference to FIGS. 2 and 3. The method of this embodiment is for manufacturing the semiconductor device shown in FIG. 1.

First, as shown in FIG. 2(a), the n-type silicon semiconductor region 2, which is isolated by the device isolation regions 4, is formed on the substrate. Then, as shown in FIG. 2(b), an insulating layer 6 is formed on the surface of the semiconductor region 2, and as shown in FIG. 2(c), a polycrystalline silicon layer 8 is grown on the insulating layer 6. Subsequently, the polycrystalline silicon layer 8 and the insulating layer 6 are patterned by the use of the photolithography technique, RIE (Reactive Ion Etching) technique, etc., to form the polycrystalline silicon gate electrode 8a and the gate insulating layer 6a, as shown in FIG. 2(d). Thereafter, as shown in FIG. 2(e), a gate sidewall 10 is formed at the side portion of the gate electrode 8a. The gate sidewall 10 is formed by, e.g., forming an insulating layer such as a silicon nitride (SiN) layer or a TEOS (Tetra-Etoxy-Ortho-Silicate) layer on the entire surface, and by etching back the insulating layer by RIE.

Next, as shown in FIG. 3(a), ion implantation of germanium into the n-type silicon semiconductor region 2 using the gate electrode 8a and the gate sidewall 10 as masks is performed to damage the n-type semiconductor region 2, thereby forming the germanium-containing impurity regions 12, which are in the amorphous state containing many crystal defects.

Then, as shown in FIG. 3(b), the gate sidewall 10 is removed by performing the etching with hot phosphoric acid in the case where the gate sidewall 10 is formed of silicon nitride layer, or with dilute hydrofluoric acid in the case where the gate sidewall 10 is formed of TEOS. Subsequently, germanium ion implantation into the n-type silicon semiconductor region using the gate electrode 8a as a mask is performed again to form the germanium containing impurity regions 14, as shown in FIG. 3(b). The impurity regions 14 are shallower than the impurity regions 12, and formed near the surface of the semiconductor region 2 between the channel region immediately below the gate electrode 8a and the impurity regions 12. As in the case of the impurity regions 12, the impurity regions 14 contain many crystal defects. The acceleration voltage $\beta$ at the time of the germanium ion implantation to form the impurity regions 14 is lower than the acceleration voltage $\alpha$ at the time of ion implantation to form the impurity regions 12. For example, assuming that the acceleration voltage at the time of the boron implantation for forming extension regions 16, which will be described later, is 0.2 keV, it is preferable that $\alpha$ is 5 keV, $\beta$ is 3 keV, and the dose amount is $5 \times 10^{14}$ cm$^{-2}$.

Then, as shown in FIG. 3(c), boron or $BF_2$ ion implantation is performed to form the extension regions 16. The extension regions 16 are shallower than the impurity regions 14. After this, the annealing at a temperature of 800° C. or less may be performed to restore the crystal defects.

Subsequently, as shown in FIG. 3(d), the gate sidewall 18 is formed at the side portion of the gate electrode 8a by forming an insulating layer such as a silicon nitride (SiN) layer or a TEOS layer on the entire surface, and by etching back the insulating layer by RIE. The width of the gate sidewall 18 is wider than the gate sidewall 10 formed in the stage shown in FIG. 2(e).

Then, as shown in FIG. 3(e), boron or $BF_2$ implantation into the semiconductor region 2 is performed using the gate electrode 8a and the gate sidewall 18 as masks to form diffusion layer regions 20. The impurity concentration of the diffusion layer regions 20 is higher than that of the extension regions 16. At the same time as the forming of the diffusion layer regions 20, the doping of the gate electrode 8a is performed to make it conductive.

After the boron or $BF_2$ ion plantation is performed, annealing is performed to activate the extension regions 16 and the diffusion layer regions 20, to form the two-step extension regions 16a and 16b and the source/drain regions 20a shown in FIG. 1. Thereafter, the semiconductor device is manufactured through the well-known salicide step and the metalization step.

Figure 4:
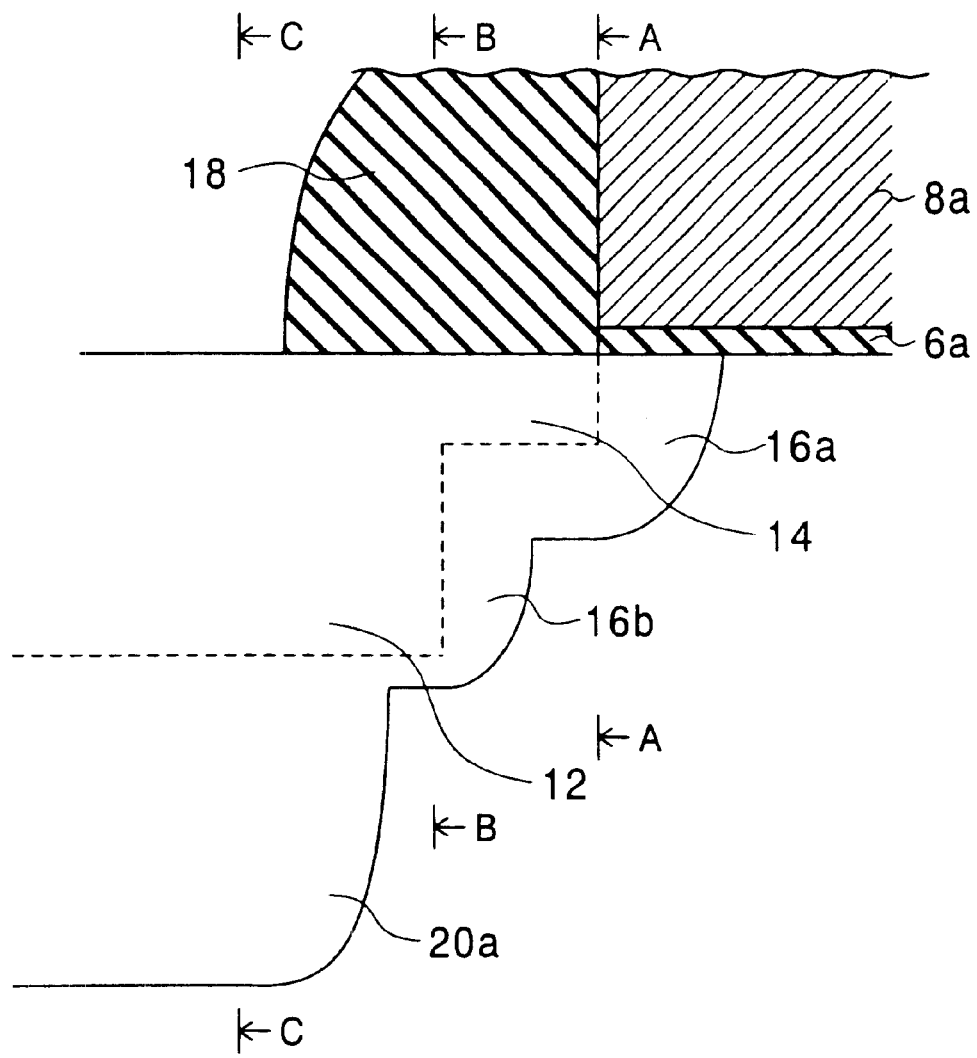
FIG. 4 is a sectional view showing in detail the structure of extension regions of the semiconductor device manufactured by the second embodiment of the present invention.

Next, the shape of the extension regions 16a and 16b will be described in detail. FIG. 4 shows the extension regions 16a and 16b of the p-channel MOSFET of the semiconductor device relating to this embodiment. In the impurity region 12, which was formed through the germanium ion implantation with high acceleration energy, enhanced diffusion of boron is induced by the generated point defects. In the impurity region 14, which was formed through the germanium ion implantation with low acceleration energy, the diffusion coefficient of boron is changed. As a result, the diffusion layer as shown in FIG. 4 including the extension regions 16a and 16b and the source/drain regions 20a is formed.

Figure 6:
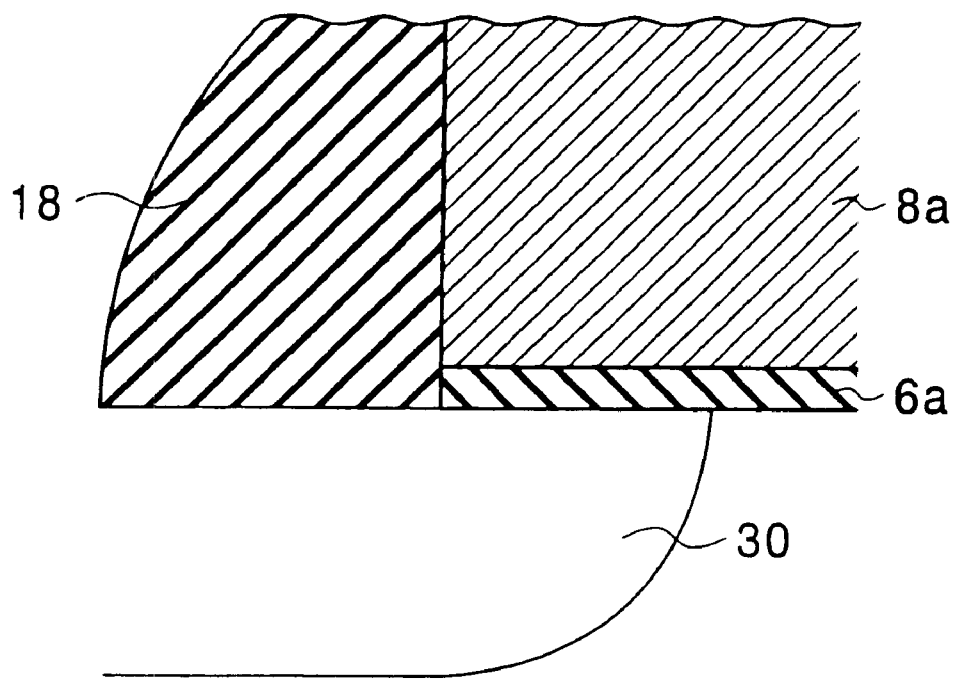
FIG. 6 is a sectional view showing an extension region of a conventional MOSFET.

FIG. 6 shows an extension region 30 of a conventional MOSFET, which is a diffusion region having a single-step structure, unlike the extension regions 16a and 16b of the MOSFET relating to this embodiment.

Figure 5:
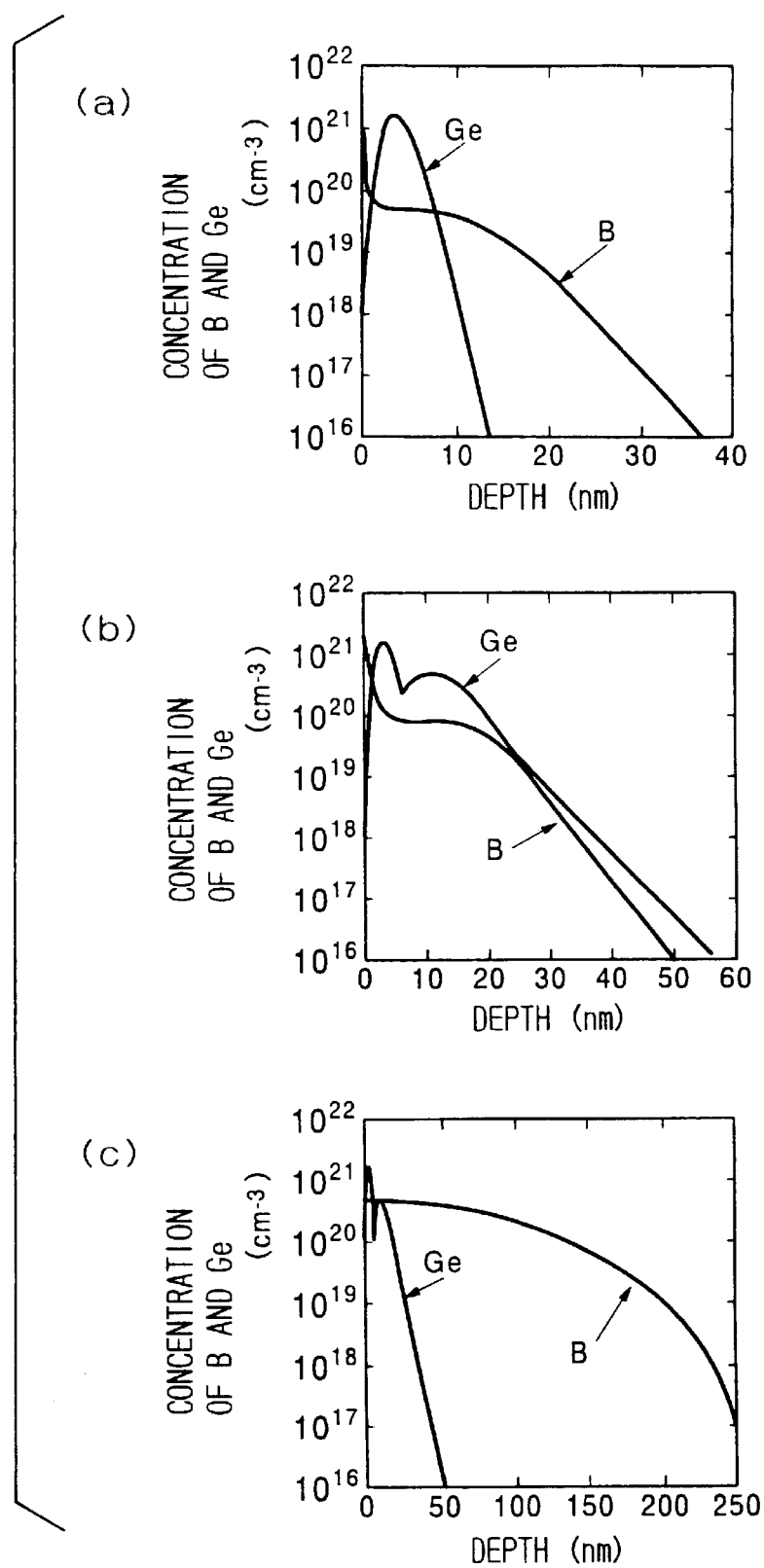
FIGS. 5(a) to 5(c) show impurity concentration profiles in the depth direction of the extension regions and source/drain regions of the semiconductor device manufactured by the second embodiment of the present invention.

FIGS. 5(a), 5(b), and 5(c) show germanium and boron concentration profiles at sections of the p-channel MOSFET relating to this embodiment, taken on lines A—A, B—B, and C—C in FIG. 4, respectively. That is, FIG. 5(a) shows the concentration profiles of the extension region 16a, FIG. 5(b) shows the concentration profiles of the extension region 16b, and FIG. 5(c) shows the concentration profiles of the source/drain region 20a, respectively. In FIGS. 5(a) to 5(c), the origin (zero point) of the depth is the surface of the semiconductor region 2. It is understood from FIGS. 5(a) to 5(c) that since germanium is hard to diffuse, two-peak concentration profiles are shown even after the activation annealing. Further, the profiles of the boron concentration distributions in the depth direction of the extension regions 16a and 16b shown in FIGS. 5(a) and 5(b) are more abrupt than the profile of the boron concentration distribution in the depth direction of the source/drain region 20a shown in FIG. 5(c). As a result, it is possible to reduce the spreading resistance in the extension regions 16a and 16b.

As described above, since the semiconductor device manufactured by the method according to this embodiment includes the extension regions 16a, of which the junction depth is shallow, it is possible to improve the short channel effect. Further, since the concentration profiles of the extension regions 16a and 16b are abrupt, it is possible to reduce the spreading resistance. Moreover, since the semiconductor device includes the extension regions 16b, of which the junction depth is deeper than that of the extension regions 16a and shallower than the source/drain regions 20a, it is possible to reduce the sheet resistance as compared with the conventional devices. Accordingly, even if the miniaturization of devices is carried out, it is possible to inhibit the increase in resistance of the extension regions, to reduce the parasitic resistance as compared with the conventional devices, and to inhibit the decrease in capability of driving current.

In the above-described first and second embodiments, ion-implantation of germanium into the semiconductor region 2 is performed to form the impurity regions 12 and 14. However, as a substitute for germanium, silicon, gallium, or indium may be used to obtain the same effects.

Further, although two kinds of impurity regions 12 and 14, each having the different depth, are formed in the above-described first and second embodiments, three or more kinds of impurity regions each having the different depth may be formed.

As described above, according to the present invention, it is possible to inhibit the decrease in capability of driving current of a p-channel MOSFET even if the miniaturization of the device is carried out.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A semiconductor device comprising:
   a gate insulating layer formed on an n-type silicon semiconductor region;
   a gate electrode formed on said gate insulating layer;
   a channel region formed immediately below said gate electrode in the semiconductor region;
   p-type source/drain regions formed at both sides of said channel region in the semiconductor region;
   p-type diffusion layer regions formed between said channel region and said source/drain regions in the semiconductor region and having a lower impurity concentration than said source/drain regions;
   first impurity regions formed near surface portions of said diffusion layer regions; and
   second impurity regions formed in part of said p-type diffusion layer regions and near surface portions of said source/drain regions, said second impurity regions being deeper than said first impurity regions,
   said first impurity regions being in a mixed crystal state.

2. The semiconductor device according to claim 1, wherein said second impurity region being in a mixed crystal state.

3. The semiconductor device according to claim 2, wherein a p-type impurity contain in said source/drain regions and said p-type diffusion layer regions is boron, and said first and second impurity regions contain germanium and boron.

4. The semiconductor device according to claim 1, further including a sidewall of an insulating material formed at a side portion of said gate electrode, and wherein a region having a germanium concentration greater than a boron concentration is provided in one of said first impurity regions immediately below an interface between said gate electrode and said sidewall.

5. The semiconductor device according to claim 1, wherein said gate electrode is made of polycrystalline silicon doped with boron.

6. A semiconductor device comprising:
   a gate insulating layer formed on an n-type silicon semiconductor region;
   a gate electrode formed on said gate insulating layer;
   a channel region formed immediately below said gate electrode in the semiconductor region;
   p-type source/drain regions formed at both sides of said channel region in the semiconductor region;
   p-type diffusion layer regions formed between said channel region and said source/drain regions in the semiconductor region and having a lower impurity concentration than said source/drain regions;
   first impurity regions formed near surface portions of said diffusion layer regions; and
   second impurity regions formed in part of said p-type diffusion layer regions and near surface portions of said source/drain regions, said second impurity regions being deeper than said first impurity regions,
   said first and second impurity regions containing an impurity element selected from the group consisting of germanium, gallium, and indium,
   wherein said diffusion layer regions include first diffusion regions formed near the surface of the semiconductor region, and second diffusion regions, of which the junction depth is deeper than that of said first diffusion regions and shallower than that of said source/drain regions.

7. The semiconductor device according to claim 6, further including a sidewall of an insulating material formed at a side portion of said gate electrode.

8. The semiconductor device according to claim 6, wherein a p-type impurity contain in said source/drain regions and said p-type diffusion layer regions is boron, and said first and second impurity regions contain germanium and boron.

9. The semiconductor device according to claim 6, wherein said gate electrode is made of polycrystalline silicon doped with boron.

* * * * *